United States Patent
Cho et al.

(10) Patent No.: US 8,120,044 B2
(45) Date of Patent: Feb. 21, 2012

(54) MULTI-CHIPS WITH AN OPTICAL INTERCONNECTION UNIT

(75) Inventors: Soo-haeng Cho, Suwon-si (KR); Kyoung-ho Ha, Seoul (KR); Han-youl Ryu, Suwon-si (KR); Sung-dong Suh, Seoul (KR); Seong-gu Kim, Pyeongtaek-si (KR); Bok-ki Min, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 373 days.

(21) Appl. No.: 12/081,277

(22) Filed: Apr. 14, 2008

(65) Prior Publication Data

US 2009/0114927 A1    May 7, 2009

(30) Foreign Application Priority Data

Nov. 5, 2007 (KR) .................. 10-2007-0112313

(51) Int. Cl.
  *H01L 27/15* (2006.01)
  *H01L 29/16* (2006.01)
  *H01L 31/12* (2006.01)
  *H01L 33/00* (2010.01)
(52) U.S. Cl. ...................... 257/82; 250/214.1
(58) Field of Classification Search .............. 257/80–82, 257/88, 98, 99, 290–292, E31.097, E31.101, 257/E31.095, E25.004, E25.006; 250/214.1; 385/31, 32, 33, 39
See application file for complete search history.

(56) References Cited

U.S. PATENT DOCUMENTS

| | | | | |
|---|---|---|---|---|
| 4,999,842 A * | 3/1991 | Huang et al. | ............... | 372/45.01 |
| 5,266,794 A * | 11/1993 | Olbright et al. | ......... | 250/214 LS |
| 5,500,540 A * | 3/1996 | Jewell et al. | ..................... | 257/82 |
| 5,546,209 A * | 8/1996 | Willner et al. | .................. | 398/43 |
| 5,999,295 A * | 12/1999 | Vowell et al. | ................. | 398/164 |
| 6,246,708 B1 * | 6/2001 | Thornton et al. | ........ | 372/50.124 |
| 6,367,989 B1 * | 4/2002 | Hartman et al. | ................ | 385/89 |
| 6,493,483 B2 * | 12/2002 | Gomes et al. | ................... | 385/24 |
| 6,788,895 B2 * | 9/2004 | Trezza | .............................. | 398/9 |
| 7,236,666 B2 * | 6/2007 | George et al. | .................... | 385/33 |
| 7,251,388 B2 * | 7/2007 | Morris et al. | .................... | 385/14 |
| 7,570,849 B2 * | 8/2009 | Spillane et al. | ................. | 385/30 |
| 2001/0015992 A1 * | 8/2001 | Kimizuka et al. | ............... | 372/50 |
| 2002/0043659 A1 * | 4/2002 | Kondo | ............................ | 257/53 |

(Continued)

OTHER PUBLICATIONS

S.M. Sze "Semiconductor Devices. Physics and Technology. 2nd Edition"—(C) 2002 John Wiley and Sons, p. 317.*

(Continued)

*Primary Examiner* — N Drew Richards
*Assistant Examiner* — Grant Withers
(74) *Attorney, Agent, or Firm* — Harness, Dickey & Pierce, P.L.C.

(57) ABSTRACT

A multi-chip having an optical interconnection unit is provided. The multi-chip having an optical interconnection unit includes a plurality of silicon chips sequentially stacked, a plurality of optical device arrays on a side of each of the plurality of the silicon chips such that the optical device arrays correspond to each other and a wiring electrically connecting the silicon chip and the optical device array attached to a side of the silicon chip, wherein the corresponding optical device arrays forms an optical connection unit by transmitting and receiving an optical signal between the corresponding optical device arrays in different layers. Each of the optical device arrays includes at least one of a light emitting device and a light receiving device.

13 Claims, 2 Drawing Sheets

U.S. PATENT DOCUMENTS

| | | | | |
|---|---|---|---|---|
| 2003/0179978 | A1* | 9/2003 | Iwasaki | 385/14 |
| 2004/0007709 | A1* | 1/2004 | Kondo | 257/80 |
| 2004/0208439 | A1* | 10/2004 | Bell et al. | 385/32 |
| 2005/0078902 | A1* | 4/2005 | Beausoleil et al. | 385/1 |
| 2006/0018588 | A1* | 1/2006 | Uchida | 385/14 |
| 2007/0194337 | A1* | 8/2007 | Kondo | 257/98 |
| 2011/0133063 | A1* | 6/2011 | Ji et al. | 250/227.24 |

OTHER PUBLICATIONS

S.M. Sze Semiconductor Devices. Physics and Technology. 2nd Edition, © 2002, John Wiley and Sons.*

* cited by examiner

MULTI-CHIPS WITH AN OPTICAL INTERCONNECTION UNIT

PRIORITY STATEMENT

This application claims the benefit of priority under 35 U.S.C. §119 from Korean Patent Application No. 10-2007-0112313, filed on Nov. 5, 2007, in the Korean Intellectual Property Office, the disclosure of which is incorporated herein in its entirety by reference.

BACKGROUND

1. Field

Example embodiments relate to multi-chips having an optical interconnection unit and methods of manufacturing the same. Other example embodiments relate to multi-chips having an optical interconnection unit on a side of the multi-chip and methods of manufacturing the same.

2. Description of the Related Art

In a multi-chip structure in which silicon chips are stacked, a connection method (e.g., a wire bonding method or a through silicon via hole connection method) may be used for an electrical connection between the silicon chips.

In the wire bonding method, as the length of the wire increases, a signal delay may occur if an ultra high speed signal is transmitted. Because the wire bonding method requires bonding pads, the bonding pad area increases as the stacking number of the silicon chips increases, making it difficult to manufacture a compact chip.

In the through silicon via hole connection method, an resistive capacitive (RC) delay is less than the wire bonding method and power consumption is minimal. The through silicon via hole connection requires complicated processes (e.g., a via hole forming process, an insulation process, a metal filling process or the like).

In order to have an optical connection, optical interconnection units including a light emitting device and a light receiving device may be installed on chips facing each other. Because the thicknesses of the light emitting device and the light receiving device are approximately between a few tens of μm to 200 μm, an inter layer distance between the facing chips increases, making it difficult to realize a compact multi-chip package.

SUMMARY

Example embodiments relate to multi-chips having an optical interconnection unit and methods of manufacturing the same. Other example embodiments relate to multi-chips having an optical interconnection unit on a side of the multi-chip and methods of manufacturing the same.

Example embodiments provide multi-chips having an optical interconnection unit that has a decreased inter-chip vertical distance by forming an array of a light emitting device and a light receiving device on a side surface of each of the multi-chips.

According to example embodiments, there is provided a multi-chip having an optical interconnection unit including a plurality of silicon chips that are stacked sequentially (or in parallel), a plurality of optical device arrays attached on a side of each of the silicon chips such that the optical device arrays correspond to each other, and a wiring electrically connecting the plurality of silicon chips and the plurality of optical device arrays attached to a side of each of the silicon chips wherein the corresponding optical device arrays form an optical connection unit by transmitting and receiving an optical signal between the corresponding optical device arrays in different layers. Each of the optical device arrays includes at least one of a light emitting device and a light receiving device. The multi-chip may include a focusing lens formed on a surface of the light emitting device.

The light emitting device may be a vertical cavity surface emitting laser (VCSEL).

The wiring may be a wire or a solder bonding.

The optical device arrays may be formed of a group III-V semiconductor compound.

According to example embodiments, there is provided a multi-chip having an optical interconnection unit including a plurality of silicon chips that are stacked sequentially (or in parallel), a plurality of optical device arrays formed to (or on) a side of each of the silicon chips such that the optical device arrays correspond to each other, and a wiring electrically connecting the silicon chip and the optical device array attached to a side of the silicon chip, wherein the corresponding optical device arrays form an optical connection unit by transmitting and receiving an optical signal between the corresponding optical device arrays in different layers. Each of the optical device arrays includes at least one of a light emitting device and a light receiving device.

The light receiving device may be a p-n junction photodiode formed in a silicon substrate extended from the corresponding silicon chips. The light emitting device, which corresponds to the p-n junction photodiode, may emit light having a wavelength of 1 μm or less.

The light receiving device may be formed of a group III-V semiconductor compound. The light emitting device corresponding to the light receiving device may emit light having a wavelength of 1.2 μm or greater wherein at least one of the plurality of the silicon chips is interposed between the light emitting device and the light receiving device.

According to example embodiments, there are provided methods of manufacturing a multi-chip having an optical interconnection unit including sequentially stacking a plurality of silicon chips, arranging a plurality of optical device arrays individually at a side of one of the plurality of the silicon chips such that the plurality of optical device arrays correspond to each other, electrically connecting each of the silicon chips to the optical device array on the side thereof using wiring, and forming the optical interconnection unit by transmitting and receiving an optical signal between the corresponding optical device arrays. Each of the plurality of optical device arrays includes at least one of a light emitting device and a light receiving device.

Arranging the plurality of optical device arrays may include attaching the plurality of optical device arrays to the side of the silicon chips. A focusing lens may be positioned on a surface of the light emitting device.

According to other example embodiments, arranging the plurality of optical device arrays may include forming the plurality of optical device arrays on the side of the silicon chips. The light receiving device may be a p-n junction photodiode formed in a silicon substrate extended from the corresponding silicon chip. The focusing lens may be positioned on a surface of the light emitting device.

A light emitting device of a first optical device array may correspond to a light receiving device of a second optical device array. The light emitting device of the first optical device array may emit a light having a wavelength of 1.2 μm or greater. The light receiving device of the second optical device array may include a group III-V semiconductor compound.

BRIEF DESCRIPTION OF THE DRAWINGS

Example embodiments will be more clearly understood from the following detailed description taken in conjunction with the accompanying drawings.

FIG. 1 is a diagram illustrating an exploded perspective view of a multi-chip having an optical interconnection unit according to example embodiments;

FIG. 2 is a diagram illustrating a schematic cross-sectional view of a multi-chip having an optical interconnection unit according to example embodiments; and FIG. 3 is a diagram illustrating a schematic cross-sectional view of a multi-chip having an optical interconnection unit according to example embodiments.

DETAILED DESCRIPTION OF EXAMPLE EMBODIMENTS

Figure 1:
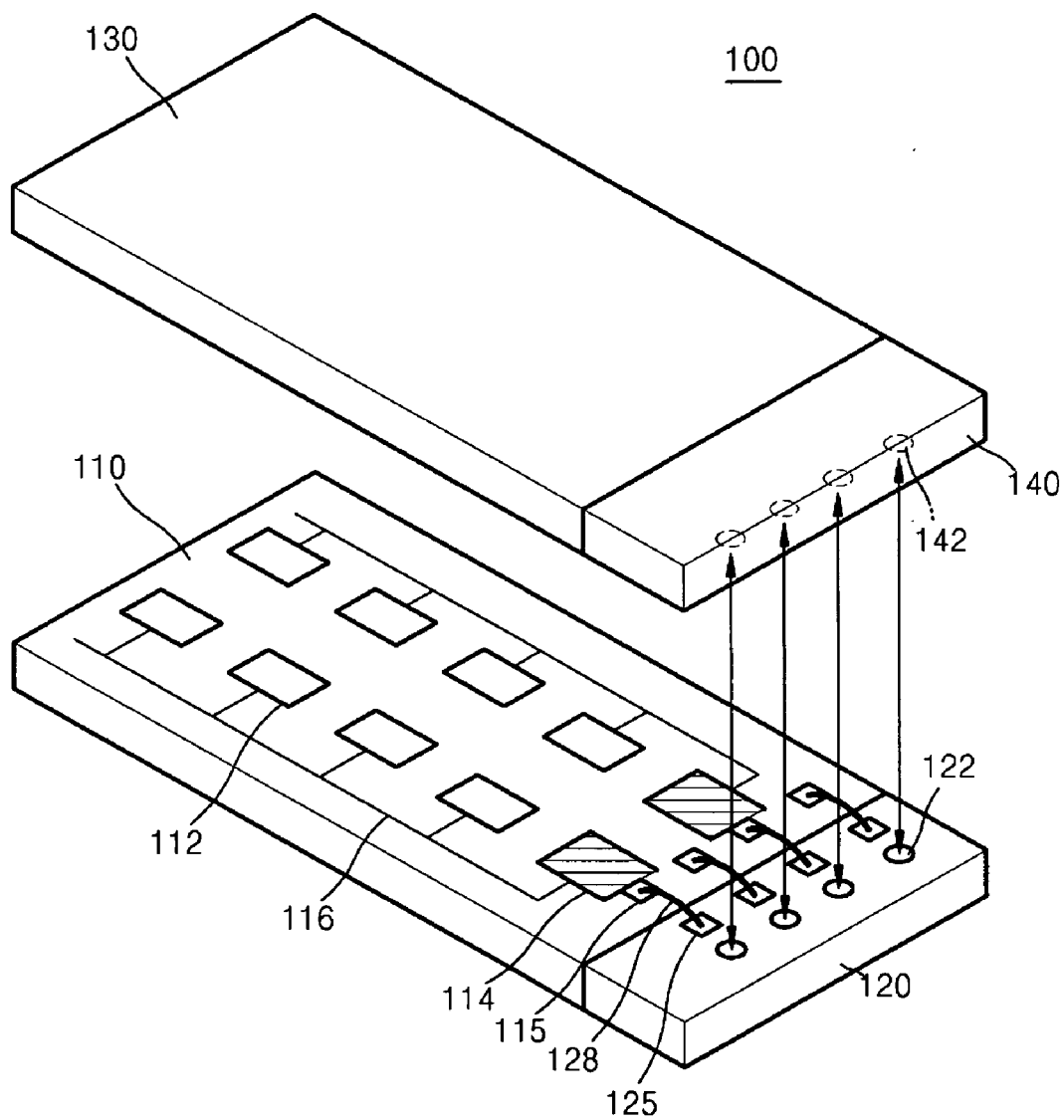
FIGS. 1-3 represent non-limiting, example embodiments as described herein.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to multi-chips having an optical interconnection unit and methods of manufacturing the same. Other example embodiments relate to multi-chips having an optical interconnection unit on a side of the multi-chip and methods of manufacturing the same.

FIG. 1 is a diagram illustrating an exploded perspective view of a multi-chip 100 having an optical interconnection unit according to example embodiments.

Referring to FIG. 1, the multi-chip 100 having an optical interconnection unit that includes a first silicon chip 110 and a second silicon chip 130. The first silicon chip 110 includes a plurality of silicon devices 112, a plurality of optical device drivers 114 and a plurality of wirings 116. A first optical device array 120 may be attached to a side of the first silicon chip 110. The first optical device array 120 includes a plurality of optical devices 122 formed of a group III-V semiconductor compound. The optical devices 122 include light emitting devices and/or light receiving devices. The optical devices 122 and the optical device drivers 114 may be electrically connected to each other by wirings 128 that are respectively connected to electrode pads 125 of the optical devices 122 and electrode pads 115 of the optical device drivers 114.

The silicon devices 112 may be random access memories (RAMs), large scale integrated circuits (LSIs) or application specific integrated circuits (ASICs) formed by using a semiconductor manufacturing process on a silicon substrate.

The second silicon chip 130 may be formed (or disposed) a predetermined distance from the first silicon chip 110. Spacers (not shown) may be formed between the first silicon chip 110 and the second silicon chip 130. The second silicon chip 130 may have a substantially similar configuration as the first silicon chip 110. Thus, the detailed descriptions thereof will not be repeated for the sake of brevity.

A second optical device array 140 may be attached to a side of the second silicon chip 130. The second optical device array 140 and optical device drivers (not shown) may be electrically connected to each other by wirings (not shown).

The second optical device array 140 includes a plurality of optical devices 142 formed of a group III-V semiconductor compound. Each of the optical devices 142 includes a light emitting device and/or a light receiving device.

The first optical device array 120 and the second optical device array 140 may be formed (or disposed) over (or corresponding to) each other. Thus, a light emitting device and a light receiving device corresponding to each other form a pair. If the first optical device array 120 is includes only light emitting devices, the second optical device array 140 may include only light receiving devices. If the first optical device array 120 includes only light receiving devices, the second optical device array 140 includes only light emitting devices.

If the first optical device array 120 includes light emitting devices and light receiving devices, the second optical device array 140 includes light receiving devices corresponding to the light emitting devices of the first optical device array 120 and light emitting devices corresponding to the light receiving devices of the first optical device array 120.

The light emitting devices of the first optical device array 120 and the second optical device array 140 may be vertical cavity surface emitting lasers (VCSELs). The light emitting devices of the first optical device array 120 and the second optical device array 140 may emit infrared rays having a wavelength of 850 nm, 1310 nm or 1550 nm, which are standard wavelengths of an optical fiber communication.

The light receiving devices of the first optical device array 120 and the second optical device array 140 may be photodiodes that detect the wavelengths of the light emitting devices.

A focusing lens (not shown) that reduces a diffusion angle of light may be formed on a surface of each of the light emitting devices to prevent cross-talk between the light emitting devices.

The optical interconnection of the multi-chip 100 having an optical interconnection unit according to example embodiments may be performed as follows. The light emitting devices emit infrared rays in response to an electrical signal received from the optical device drivers. The light receiving devices corresponding to the light emitting devices detect the infrared rays, convert the infrared rays into an electrical signal, and transmit the electrical signal to the optical device drivers connected to the light receiving devices.

The optical interconnection unit of the multi-chip 100 may be formed on a side of the silicon chip. Although the silicon chips are stacked, the thickness of the unit may not increase due to the optical interconnection unit. The signal transmitting speed may increase and the number of wire bondings between the silicon chips may be reduced because the signal is transmitted through an optical communication. Because the optical array may be attached to the silicon chip by separately manufacturing the optical device array, the manufacturing process of the multichip having optical interconnection units may be simplified.

In FIG. 1, the multi-chip 100 is shown as a structure in which two silicon chips are stacked. However, example embodiments are not limited thereto. For example, more than three silicon chips may be stacked and an optical device array may be formed (or disposed) on a side of each of the silicon chips.

Figure 2:
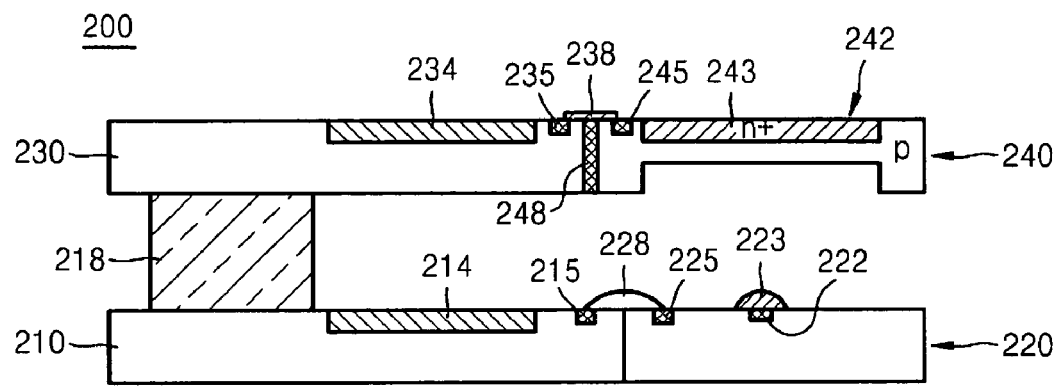

FIG. 2 is a diagram illustrating a schematic cross-sectional view of a multi-chip 200 having an optical interconnection unit according to example embodiments.

Referring to FIG. 2, the multi-chip 200 having an optical interconnection unit includes a first silicon chip 210 and a second silicon chip 230 that are stacked sequentially, or parallel, to each other. The first silicon chip 210 includes an optical device driver 214. A first optical device array 220 may be attached to a side of the first silicon chip 210. The first optical device array 220 and the optical device driver 214 may be electrically connected to each other by a wiring 228 that is electrically connected to electrode pads 225 of the first optical device array 220 and electrode pads 215 of the optical device driver 214.

The first optical device array 220 includes a plurality of light emitting devices 222 formed of a group III-V semiconductor compound. A focusing lens 223 may be formed on each of the light emitting devices 222 to reduce the spreading angle of light emitted from the light emitting device 222. The focusing lens 223 may prevent (or reduce) cross-talking between the light emitting devices 222. The first silicon chip 210 includes a silicon device (not shown) (e.g., an RAM, an LSI, an application specific integrated circuit (ASIC) or the like) formed by a semiconductor process.

The second silicon chip 230 may be formed (or disposed) a predetermined distance apart from the first silicon chip 210. A spacer 218 may be formed between the first silicon chip 210 and the second silicon chip 230 using an insulating material (e.g., epoxy) so as to maintain the second silicon chip 230 the predetermined distance apart from the first silicon chip 210. The second silicon chip 230 includes an optical device driver 234. A second optical device array 240 may be formed (or disposed) on a region to correspond to the first optical device array 220. The second optical device array 240 may be a plurality of p-n junction photodiodes 242. The p-n junction photodiodes 242 and the optical device driver 234 may be electrically connected to each other by a wiring 238 that is electrically connected to electrode pads 245 of the p-n junction photodiodes 242 and electrode pads 235 of the optical device drivers 234.

The p-n junction photodiodes 242 include an n-type impurity region 243 on an extended portion of the first silicon chip 210, which is a p-type silicon. If light having a wavelength of 1 μm or less reaches the p-n junction photodiodes 242, pairs of electrons and holes may be generated in the p-n junction photodiodes 242. The electrons may be moved to the n-type region 243 by a positive voltage applied to the n-type region 243. As such, an electrical signal may be generated for transmission to the optical device driver 234.

The second silicon chip 230 includes an isolation region 248 that electrically separates the second optical device array 240 from the second silicon chip 230.

The light emitting devices 222 may be VCSELs. The light emitting devices 222 may emit light having a wavelength of 1 μm or less (e.g., infrared rays having a standard wavelength of 850 nm).

The optical interconnection of the multi-chip 200 having an optical interconnection unit according to example embodiments may operate as follows. The light emitting devices 222 emit infrared rays in response to an electrical signal received from the optical device drivers 214. The p-n junction photodiodes 242 (or light receiving devices) corresponding to the light emitting devices 222, detect the infrared rays, convert the infrared rays into an electrical signal, and transmit the electrical signal to the optical device drivers 234 connected to the p-n junction photodiodes 242 (or light receiving devices).

In FIG. 2, the optical devices connected to the first silicon chip 210 may be light emitting devices 222 all formed of a group III-V semiconductor compound. The optical devices connected to the second silicon chip 230 may be all light receiving devices 242. However, example embodiments are not limited thereto. For example, the first optical device array 220 and the second optical device array 240 may each include the light emitting devices and the light receiving devices, and only the region of the light receiving devices is extended from the silicon layer to form the p-n junction photodiodes 242.

The optical interconnection unit of the multi-chip 200 may be formed on a side of the silicon chip. Although the silicon chips are stacked, the thickness of the multi-chip 200 may not increase due to the optical interconnection unit. Because the light receiving devices are formed by doping in the silicon layer, the bonding process of the light receiving device array to the silicon chip may be reduced.

In FIG. 2, the multi-chip 200 is shown having a structure in which two silicon chips are stacked. However, example embodiments are not limited thereto. For example, more than three silicon chips may be stacked and an optical device array may be formed (or disposed) on a side of each of the silicon chips.

Figure 3:
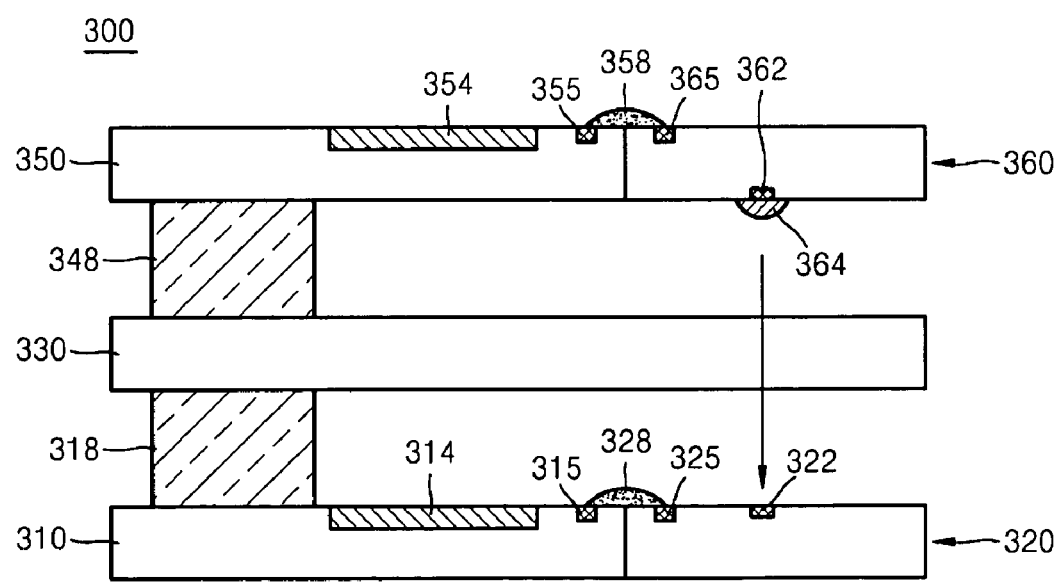

FIG. 3 is a diagram illustrating a schematic cross-sectional view of a multi-chip 300 having an optical interconnection unit according to example embodiments.

Referring to FIG. 3, the multi-chip 300 includes a first silicon chip 310, a second silicon chip 330 and a third silicon chip 350, which are stacked sequentially, or parallel, to each other. The first silicon chip 310 includes an optical device driver 314. A first optical device array 320 may be attached to a side of the first silicon chip 310. The first optical device array 320 may include a plurality of optical devices 322 formed of a group III-V semiconductor compound. The optical devices 322 and the optical device driver 314 may be electrically connected by a solder bonding 328 that electrically connect electrode pads 325 of the optical devices 322 and electrode pads 315 of the optical device driver 314.

The optical devices 322 may include a plurality of light emitting devices and/or a plurality of light receiving devices. The first silicon chip 310 includes a silicon device (not shown) (e.g., a RAM, an LSI, an ASIC or the like) formed by a semiconductor process.

The second silicon chip 330 may be formed (or disposed) a predetermined distance apart from the first silicon chip 310. A spacer 318 may be formed between the first silicon chip 210 and the second silicon chip 230 using an insulating material (e.g., epoxy).

The third silicon chip 350 may be formed (or disposed) a predetermined distance apart from the second silicon chip 330. A spacer 348 may be formed between the second silicon chip 330 and the third silicon chip 350. The third silicon chip 350 includes an optical device driver 354. The third silicon chip 350 includes a second optical device array 360 that is formed on a region of the third silicon chip 350 and facing the corresponding first optical device array 320. The second optical device array 360 may include a plurality of optical devices 362 formed of a group III-V semiconductor compound. The optical devices 362 and the optical device driver 354 may be electrically connected by a solder bonding 358 that is electrically connected to electrode pads 365 of the optical devices 362 and electrode pads 355 of the optical device driver 354.

The optical devices 362 may include a plurality of light emitting devices and/or a plurality of light receiving devices. If the optical devices 362 are light emitting devices, a focusing lens 364 may be formed on each of the light emitting devices. The focusing lens 364 irradiates light generated from the optical devices 362 onto the light receiving device 322 of the first optical device array 320 through the second silicon chip 330.

The optical devices 362 may emit light that transmits through the silicon layer (e.g., infrared rays having a wavelength of 1.2 μm or greater or infrared rays having a wavelength of 1310 nm or 1550 nm (which is a standard wavelength for optical fiber communication)). The optical devices 362 may be VCSELs to vertically emit light.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A multi-chip having an optical interconnection unit, comprising:
    a plurality of silicon chips sequentially stacked;
    a plurality of optical device arrays individually at a lateral side of one of the plurality of the silicon chips such that each of the plurality of the optical device arrays corresponds to one of the plurality of the silicon chips, wherein each of the plurality of the optical device arrays includes at least one of a light emitting device and a light receiving device, the light-emitting device and the light receiving device correspond to each other and are arranged vertically on different optical device arrays of the plurality of optical device arrays; and
    a wiring electrically connecting each of the silicon chips to the optical device array on the lateral side thereof, wherein the corresponding light-emitting device and light-receiving device vertically transmit an optical signal between each other to form the optical interconnection unit, and the corresponding silicon chips and optical device arrays are separately disposed side-by-side.

2. The multi-chip of claim 1, wherein the plurality of optical device arrays are individually attached to the lateral side of the respective silicon chip.

3. The multi-chip of claim 2, further comprising a focusing lens on a surface of the light emitting device.

4. The multi-chip of claim 2, wherein the light emitting device is a vertical cavity surface emitting laser (VCSEL).

5. The multi-chip of claim 2, wherein the wiring is a wire or a solder bonding.

6. The multi-chip of claim 2, wherein the optical device arrays include a group III-V semiconductor compound.

7. The multi-chip of claim 1, wherein the plurality of optical device arrays are individually formed on the lateral side of the respective silicon chip.

8. The multi-chip of claim 7, wherein the light receiving device is a p-n junction photodiode formed in a silicon substrate extended from the corresponding silicon chip.

9. The multi-chip of claim 8, wherein the light emitting device is a vertical cavity surface emitting laser (VCSEL).

10. The multi-chip of claim 8, wherein the light emitting device, corresponding to the p-n junction photodiode, emits light having a wavelength of 1 µm or less.

11. The multi-chip of claim 10, wherein the p-n junction photodiode is formed of a group III-V semiconductor compound.

12. The multi-chip of claim 7, further comprising a focusing lens on a surface of the light emitting device.

13. The multi-chip of claim 7, wherein a light emitting device of a first optical device array corresponds to a light receiving device of a second optical device array, and the light emitting device of the first optical device array emits a light having a wavelength of 1.2 µm or greater and the light receiving device includes a group III-V semiconductor compound.

* * * * *